(12) United States Patent
Agarwal

(10) Patent No.: US 9,978,606 B2
(45) Date of Patent: May 22, 2018

(54) METHODS FOR ATOMIC LEVEL RESOLUTION AND PLASMA PROCESSING CONTROL

(71) Applicant: APPLIED MATERIALS, INC., Santa Clara, CA (US)

(72) Inventor: Ankur Agarwal, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days. days.

(21) Appl. No.: 15/279,058

(22) Filed: Sep. 28, 2016

(65) Prior Publication Data

US 2017/0098549 A1   Apr. 6, 2017

Related U.S. Application Data

(60) Provisional application No. 62/236,643, filed on Oct. 2, 2015.

(51) Int. Cl.
*H01L 21/3065* (2006.01)
*H01L 21/311* (2006.01)
(Continued)

(52) U.S. Cl.
CPC ...... *H01L 21/30655* (2013.01); *C23C 16/458* (2013.01); *C23C 16/45544* (2013.01); *C23C 16/505* (2013.01); *H01J 37/32082* (2013.01); *H01J 37/32165* (2013.01); *H01J 37/32174* (2013.01); *H01J 37/32715* (2013.01); *H01J 37/32816* (2013.01); *H01L 21/0212* (2013.01); *H01L 21/0228* (2013.01); *H01L 21/02274* (2013.01); *H01L 21/31122* (2013.01); *H01L 21/67069* (2013.01); *H01J 2237/334* (2013.01)

(58) Field of Classification Search
None
See application file for complete search history.

(56) References Cited

U.S. PATENT DOCUMENTS 6,218,196 B1   4/2001   Ise et al.
6,472,822 B1   10/2002  Chen et al.
(Continued)

OTHER PUBLICATIONS

International Search Report and Written Opinion dated Jan. 13, 2017 for PCT Application No. PCT/US2016/054348.

*Primary Examiner* — Shamim Ahmed
(74) *Attorney, Agent, or Firm* — Moser Taboada; Alan Taboada

(57) ABSTRACT

Methods and apparatus for processing substrates are provided. In some embodiments, methods of processing substrates includes: (a) providing a process gas comprising a polymer-forming gas and an etching gas between a first electrode and a second electrode within the processing volume, wherein the first electrode is opposite the second electrode; (b) applying a first voltage waveform from a first RF power source to the second electrode to form a plasma from the process gas, wherein the plasma has a first ion energy to deposit a polymer layer directly atop a dielectric layer of the substrate; and (c) adjusting the first voltage waveform to a second voltage waveform to increase an ion energy of the plasma from the first ion energy to a second ion energy, wherein the plasma at the second ion energy ceases to deposit the polymer layer and proceeds to etch the polymer layer and the dielectric layer.

20 Claims, 4 Drawing Sheets

(51) Int. Cl.
*C23C 16/458* (2006.01)
*H01J 37/32* (2006.01)
*C23C 16/455* (2006.01)
*C23C 16/505* (2006.01)
*H01L 21/02* (2006.01)
*H01L 21/67* (2006.01)

(56) References Cited

U.S. PATENT DOCUMENTS

| | | | |
|---|---|---|---|
| 6,566,272 B2 | 5/2003 | Paterson et al. | |
| 6,818,562 B2 | 11/2004 | Todorow et al. | |
| 6,942,813 B2 | 9/2005 | Cupertino et al. | |
| 7,141,514 B2 | 11/2006 | Chua | |
| 7,214,628 B2 | 5/2007 | Chua | |
| 7,718,538 B2 | 5/2010 | Kim et al. | |
| 7,737,042 B2 | 6/2010 | Kim et al. | |
| 7,771,606 B2 | 8/2010 | Kim et al. | |
| 7,967,944 B2 | 6/2011 | Shannon et al. | |
| 8,002,945 B2 | 8/2011 | Shannon et al. | |
| 8,018,164 B2 | 9/2011 | Shannon et al. | |
| 8,264,154 B2 | 9/2012 | Banna et al. | |
| 8,324,525 B2 | 12/2012 | Shannon et al. | |
| 8,337,661 B2 | 12/2012 | Shannon et al. | |
| 8,357,264 B2 | 1/2013 | Shannon et al. | |
| 8,404,598 B2 | 3/2013 | Liao et al. | |
| 8,652,341 B2* | 2/2014 | Gessner | C03C 15/00 216/67 |
| 8,658,541 B2 | 2/2014 | Lee et al. | |
| 8,962,488 B2 | 2/2015 | Liao et al. | |
| 8,974,684 B2* | 3/2015 | Banna | H01L 21/31116 216/67 |
| 9,269,587 B2 | 2/2016 | Kim et al. | |
| 9,318,304 B2 | 4/2016 | Leray et al. | |
| 9,520,294 B2 | 12/2016 | Agarwal et al. | |
| 9,536,749 B2 | 1/2017 | Marakhtanov et al. | |
| 2005/0136682 A1* | 6/2005 | Hudson | H01L 21/31116 438/714 |
| 2005/0221021 A1 | 10/2005 | Strang | |
| 2011/0017139 A1 | 1/2011 | Chiang et al. | |
| 2013/0059448 A1* | 3/2013 | Marakhtanov | H01J 37/32091 438/711 |
| 2014/0305589 A1 | 10/2014 | Valcore, Jr. | |
| 2014/0349493 A1 | 11/2014 | Rueger | |
| 2015/0002018 A1 | 1/2015 | Lill et al. | |
| 2015/0011088 A1* | 1/2015 | McNie | C23C 16/52 438/689 |
| 2015/0144596 A1 | 5/2015 | Brouk et al. | |
| 2016/0064244 A1* | 3/2016 | Agarwal | B81C 1/00531 438/712 |
| 2017/0069469 A1* | 3/2017 | Goodyear | H01J 37/32174 |
| 2017/0076955 A1* | 3/2017 | Hudson | H01L 21/30655 |

* cited by examiner

METHODS FOR ATOMIC LEVEL RESOLUTION AND PLASMA PROCESSING CONTROL

CROSS-REFERENCE TO RELATED APPLICATIONS

The application claims benefit of U.S. provisional patent application Ser. No. 62/236,643, filed Oct. 2, 2015, which is herein incorporated by reference in its entirety.

FIELD

Embodiments of the present disclosure generally relate to methods of processing a substrate.

BACKGROUND

One process useful in the continuous scaling down of features is an atomic layer etch during plasma processing of a substrate. Conventionally, the atomic layer etch is performed using a processing scheme which relies on switching gas mixtures to achieve the appropriate plasma chemical composition for passivation (functionalization, adsorption, deposition) and the appropriate plasma chemical composition for a subsequent etch process.

Typically, the substrate is first exposed to a minimally etching plasma to passivate an upper layer. During the passivation process, the ion energies of the plasma should be less than the threshold for etching the passivated top layer. Next, the passivated layer is exposed to an etching plasma to remove the passivated top layer. During the etch process, the ion energies of the plasma should be less than the threshold for sputtering the unpassivated substrate. However, such a scheme suffers from slow processing speeds due to the purging of the process chamber of the previous gas mixture between the passivation and etching processes. Accordingly, the inventor has provided an improved method of processing a substrate that achieves atomic layer etching at significantly higher speeds.

Accordingly, the inventor has developed improved methods of processing a substrate.

SUMMARY

Methods and apparatus for processing a substrate are provided herein. In some embodiments, a method of processing a substrate within a processing volume of a substrate processing chamber includes: (a) providing a process gas comprising a polymer-forming gas and an etching gas between a first electrode and a second electrode within the processing volume, wherein the first electrode is opposite the second electrode; (b) applying a first voltage waveform from a first RF power source to the second electrode to form a plasma from the process gas, wherein the plasma has a first ion energy to deposit a polymer layer directly atop a dielectric layer of the substrate; and (c) adjusting the first voltage waveform to a second voltage waveform to increase an ion energy of the plasma from the first ion energy to a second ion energy, wherein the plasma at the second ion energy ceases to deposit the polymer layer and proceeds to etch the polymer layer and the dielectric layer.

In some embodiments, a substrate processing apparatus includes: a substrate processing chamber having a substrate processing volume; a substrate support pedestal disposed within the substrate processing volume; first electrode disposed within the substrate support pedestal; a second electrode disposed in the substrate processing volume opposite the first electrode; a first waveform adjuster coupled to the first electrode; a first RF power source coupled to the first waveform adjuster; a second waveform adjuster coupled to the second electrode; and a second RF power source coupled to the second waveform adjuster.

In some embodiments, a method of processing a substrate includes: (a) providing a substrate to a substrate processing chamber comprising a first electrode and a second electrode disposed opposite the first electrode; (b) providing a process gas to the substrate processing chamber, wherein the process gas comprises a polymer-forming gas and an etching gas; (c) applying a first voltage waveform from a first RF power source to the second electrode to form a plasma from the process gas, wherein the first RF power source is coupled to the second electrode through a first waveform adjuster, and wherein the plasma has a first ion energy to deposit a polymer layer directly atop a dielectric layer of the substrate; and (d) adjusting the first voltage waveform to a second waveform to increase an ion energy of the plasma from the first ion energy to a second ion energy, wherein the plasma at the second ion energy ceases to deposit the polymer layer and proceeds to etch the polymer layer and the dielectric layer.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
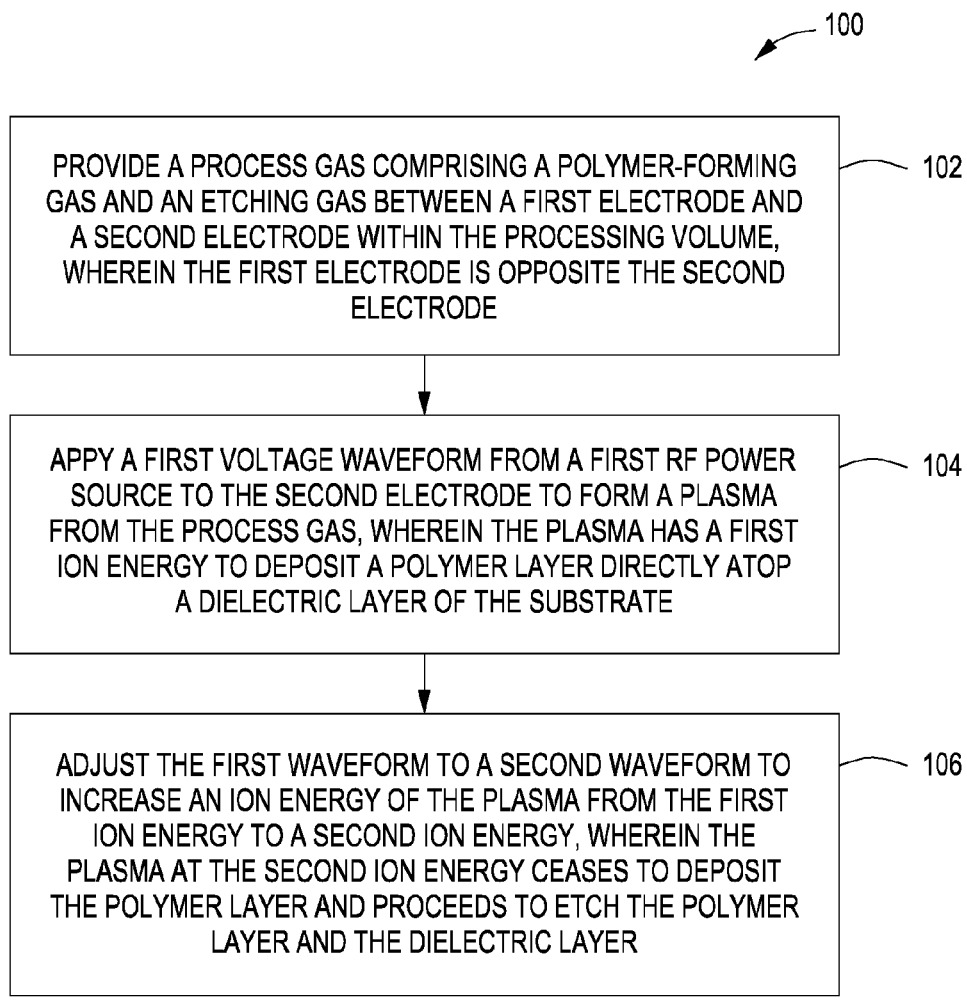
FIG. 1 depicts a flow chart of a method for processing a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for processing a substrate are provided herein. The inventive methods advantageously facilitate atomic layer etching of a dielectric material at significantly higher speeds. Embodiments of the inventive methods can advantageously provide passivation and atomic layer etching while utilizing a predetermined plasma chemical composition from a single gas mixture. As a result, the methods described in the disclosure allow for atomic layer etching without the need to introduce multiple gas mixtures and without the need to purge gases from a process chamber to perform atomic layer etching. The methods provided in the disclosure may allow for selection of a passivation regime or etching regime via control of the ion energy distribution (IED) of the plasma.

FIG. 1 depicts a flow chart of a method 100 for processing a substrate in accordance with some embodiments of the present disclosure. The method 100 is described herein with respect to the structure depicted in FIGS. 2A-2B. The method 100 of the present disclosure may be performed in a single process chamber capable of performing both etching and deposition. Such a suitable process chamber may be a standalone process chamber, or part of a cluster tool. Alternatively, the inventive methods disclosed herein may be performed in separate chambers that also may be standalone or part of a cluster tool.

Figure 3:
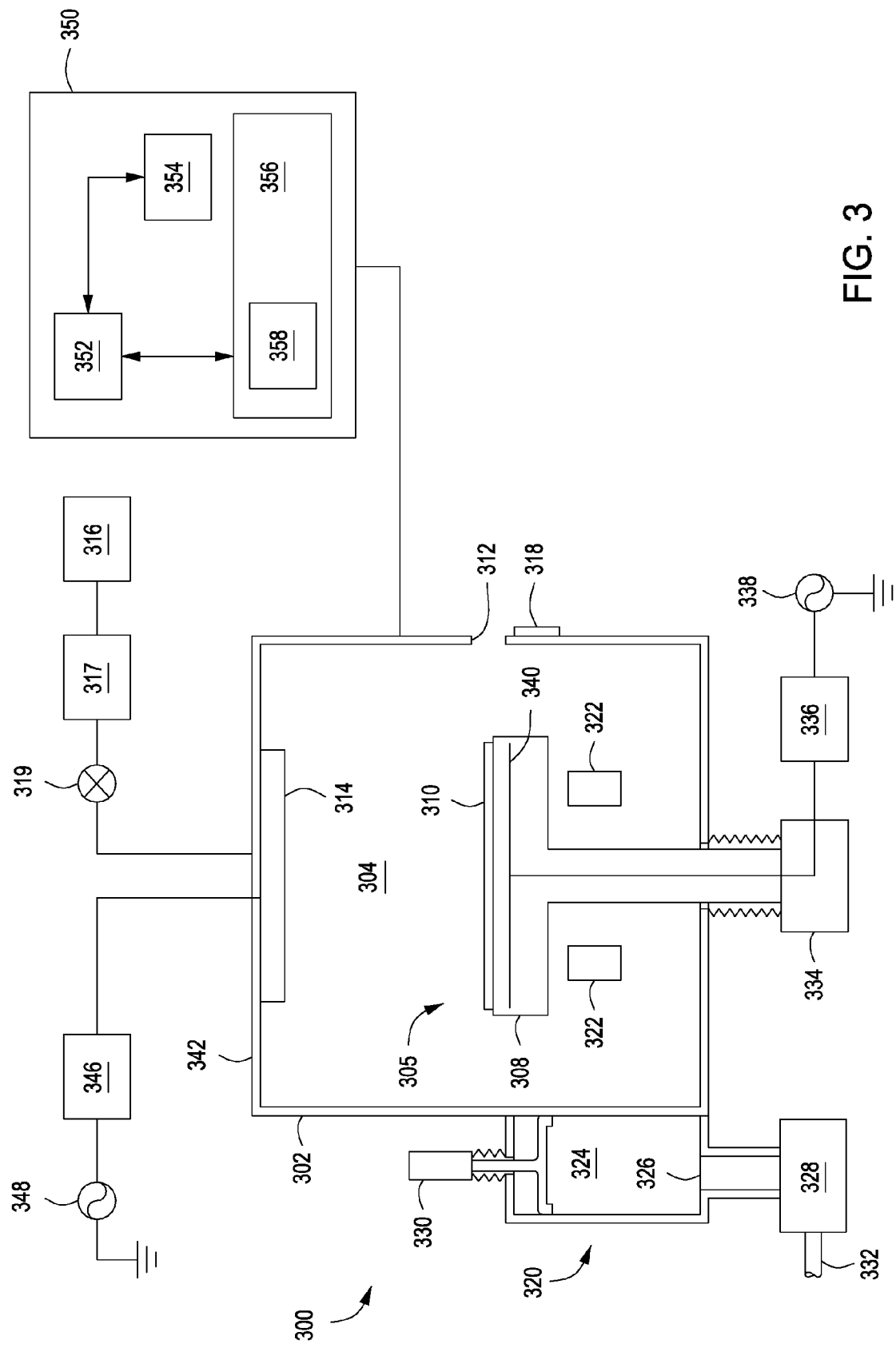
FIG. 3 depicts schematic view of a substrate processing system in accordance with some embodiments of the present disclosure.

FIG. 3 described below depicts an apparatus 300 suitable for processing a substrate in accordance with some embodiments of the present disclosure. The apparatus 300 may comprise a controller 350 and a process chamber 302 having an exhaust system 320 for removing excess process gases, processing by-products, or the like, from the interior of the process chamber 302. Exemplary process chambers may include the DPS®, ENABLER®, ADVANTEDGE™, AVATAR™, or other process chambers, available from Applied Materials, Inc. of Santa Clara, Calif. Other suitable process chambers may similarly be used.

The process chamber 302 has an inner volume 305 that may include a processing volume 304. The processing volume 304 may be defined, for example, between a substrate support pedestal 308 disposed within the process chamber 302 for supporting a substrate 310 during processing and one or more gas inlets, such as a showerhead 314 and/or nozzles provided at predetermined locations. In some embodiments, the substrate support pedestal 308 may include a mechanism that retains or supports the substrate 310 on the surface of the substrate support pedestal 308, such as an electrostatic chuck, a vacuum chuck, a substrate retaining clamp, or the like (not shown). In some embodiments, the substrate support pedestal 308 may include mechanisms for controlling the substrate temperature (such as heating and/or cooling devices, not shown) and/or for controlling the species flux and/or ion energy proximate the substrate surface.

Figure 4:
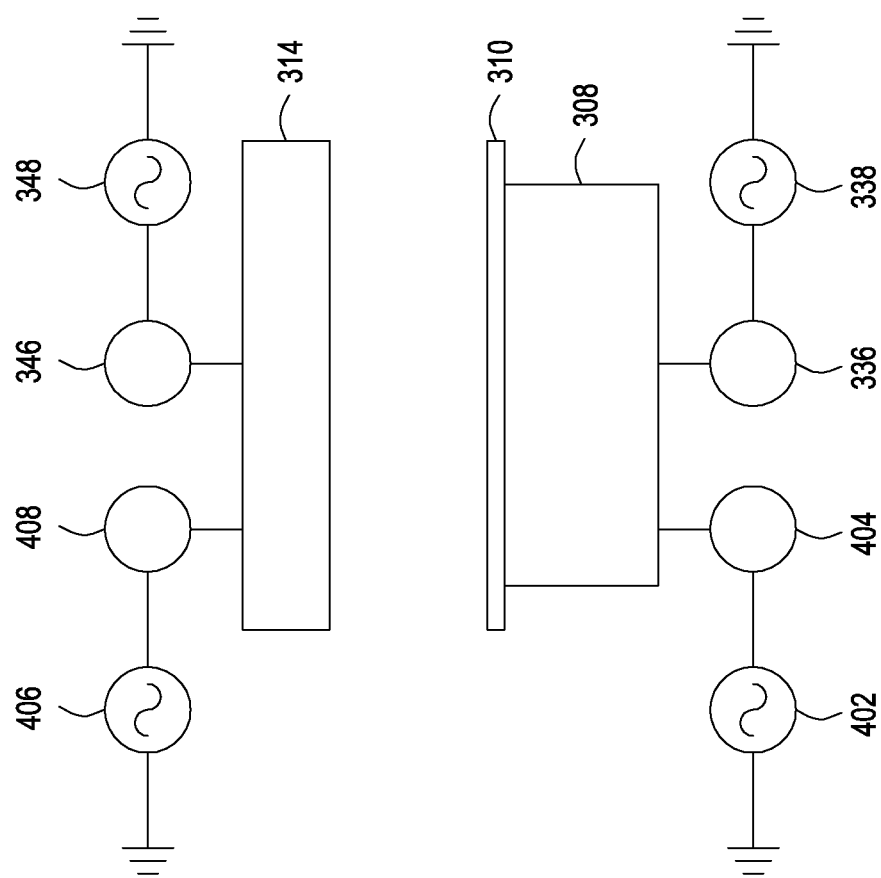
FIG. 4 depicts embodiments of RF biasing components that may be used in the processing system depicted in FIG. 3.
Figures 5A, 5B, 5C:
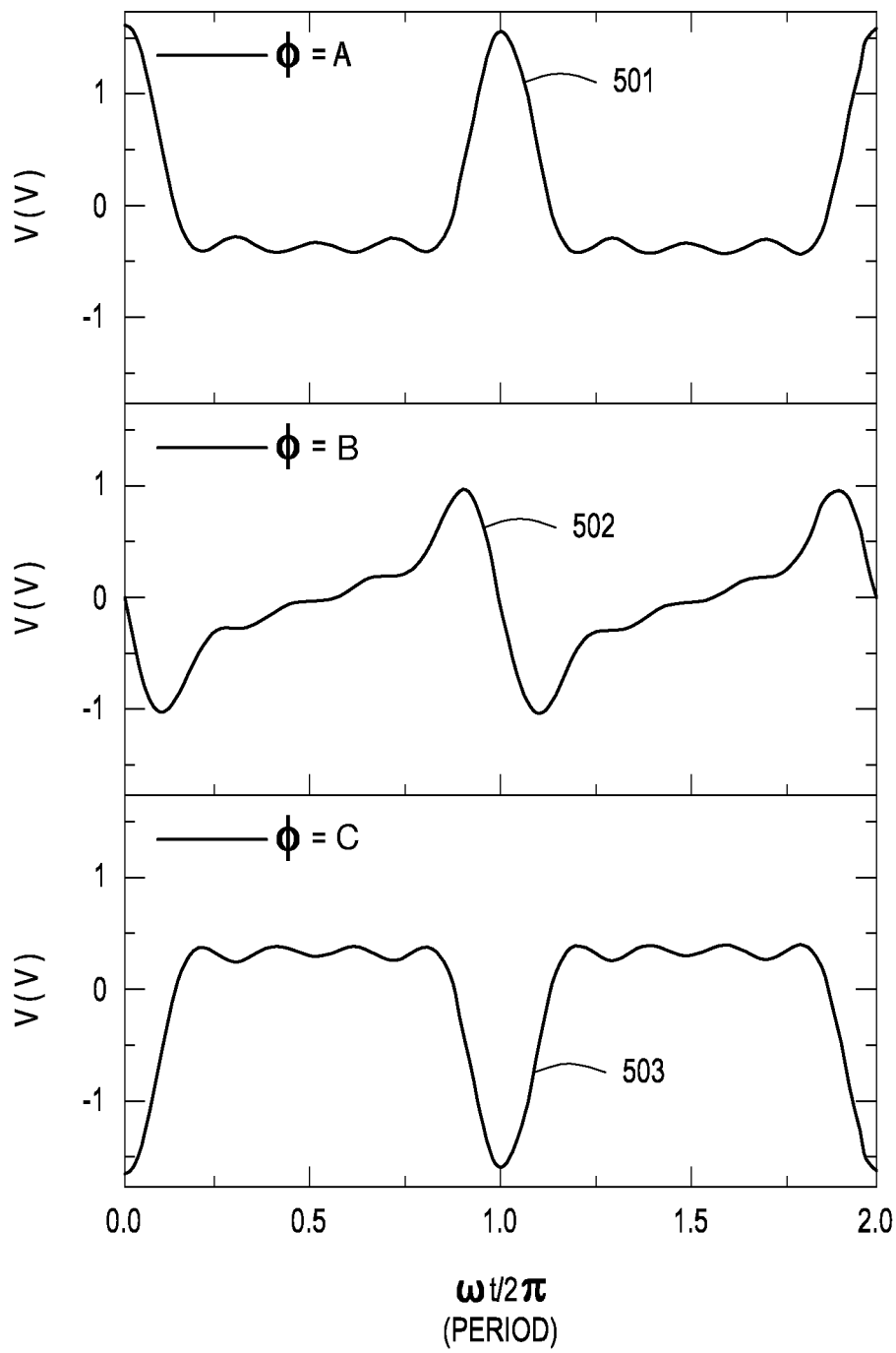
FIG. 5A-5C depict exemplary waveforms with varying phase difference that may be used in the method depicted in FIG. 1.

For example, in some embodiments, the substrate support pedestal 308 may include an RF bias electrode 340. The RF bias electrode 340 may be coupled to one or more RF bias power sources (RF power source 338 shown in FIG. 3) through one or more respective waveform adjusters (a first bias waveform adjuster 336 shown) capable of adjusting various voltage waveforms supplied to an electric apparatus. Specifically, each waveform adjuster can tailor, or adjust, the RF waveform to a non-sinusoidal waveform (for example, as shown in FIGS. 5A-C). In some embodiments, as depicted in FIG. 4, the RF bias electrode 340 may be coupled to a second RF bias power source (e.g., RF power source 402) through a second bias waveform adjuster 404 (and/or a bias pulse adjuster). The one or more bias power sources may be capable of producing up to 1200 W at a frequency ranging from about 2 MHz to about 60 MHz, such as at about 2 MHz, or about 13.56 MHz, or about 60 Mhz. The one or more bias power sources may provide either continuous or pulsed power. The one or more bias power sources may be operable in a continuous wave (CW) or pulsed mode. The one or more bias power sources may be operated at a duty cycle (e.g., the percentage of on time during the total of on time and off time in a given cycle) of between about 10% and about 90%.

Returning to FIG. 3, in some embodiments, the apparatus 300 may utilize capacitively coupled RF power for plasma processing, although the apparatus may also or alternatively use inductive coupling of RF power for plasma processing. For example, the process chamber 302 may have a ceiling 342 made from dielectric materials and a showerhead 314 that is at least partially conductive to provide an RF electrode or a separate RF electrode may be provided. The showerhead 314 (or other RF electrode) may be coupled to one or more RF power sources (RF power source 348 shown) through one or more respective waveform adjusters (a first source waveform adjuster 346 shown). In some embodiments, as depicted in FIG. 4, the showerhead 314 (or other RF electrode) may be coupled to a second RF power source (e.g., RF power source 406) through a second source waveform adjuster 408 (and/or a source pulse adjuster). The one or more plasma sources may be capable of producing up to about 3,000 W, or in some embodiments, up to about 5,000 W at a frequency of about 2 MHz and/or about 13.56 MHz or a high frequency, such as 27 MHz and/or 60 MHz. In some embodiments, each waveform adjuster may also incorporate RF impedance matching network circuitry to adjustably minimize reflected RF power due to impedance mismatch between the respective RF power supplies and the plasma in the process chamber. Alternatively, separate RF impedance matching network circuitry may be provided.

The method 100 generally begins at 102 by providing a process gas comprising a polymer-forming gas and an etching gas to a processing volume (e.g. inner volume 305 depicted in FIG. 3) of a substrate processing chamber (e.g. process chamber 302 depicted in FIG. 3). The process gas may be introduced into the processing volume by a showerhead 314. The processing volume is disposed between a first electrode (e.g. the RF bias electrode 340 in FIG. 3) and a second electrode (e.g. the showerhead 314 or a separate RF electrode as described above). In some embodiments, the pressure in the processing volume is about 20 mTorr to about 200 mTorr. The composition of the processing gas can vary depending on the specific material being etched and the polymer-forming gas that is used.

In some embodiments, the polymer forming gas comprises a fluorocarbon gas. In some embodiments, the fluorocarbon gas may be carbon tetrafluoride ($CF_4$), methyl trifluoride ($CHF_3$), octafluorocyclobutane ($C_4F_8$), hexafluorobutadiene ($C_4F_6$), nitrogen trifluoride ($NF_3$), sulfur hexafluoride ($SF_6$), or the like.

In some embodiments, the etching gas comprises a noble gas, such as argon, helium, or the like. In some embodiments, the process gas may further comprise an oxygen containing gas, such as oxygen ($O_2$) to achieve a predetermined profile and selectivity to an underlying layer.

Figure 2A:
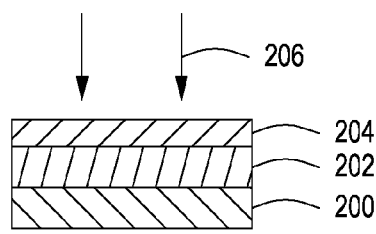
FIGS. 2A-B depict the stages of processing a substrate in accordance with some embodiments of the present disclosure.

Next, at 104, RF energy having a first voltage waveform (first waveform) is applied from a first RF power source (e.g., RF power source 348) to the second electrode to form a plasma from the process gas. The plasma is formed within the processing volume of the process chamber. As depicted in FIG. 2A, the plasma has a first ion energy 206 that deposits a polymer layer 204 directly atop a dielectric layer 202 of the substrate 200. In some embodiments, the first ion energy 206 of the plasma is about 0.1 eV to about 100 eV. The substrate 200 may be any suitable substrate used in a semiconductor manufacturing process. For example, the substrate 200 may comprise one or more of a dielectric material, silicon (Si), metals, or the like. In addition, the substrate 200 may include additional layers of materials or may have one or more completed or partially completed structures formed in, or on, the substrate 200. The substrate 200 comprises a dielectric layer 202, such as silicon oxide, a low-k material (e.g., a material having a dielectric constant less than silicon oxide, or less than about 3.9), or the like.

In some embodiments, RF energy from a second RF power source (e.g., RF power source 338) is applied to the first electrode to form the plasma. In some embodiments, the second RF power source provides about 50 W about 2000 W of power to the first electrode. In some embodiments, the RF energy from the second RF power source may have the first waveform.

Figure 2B:
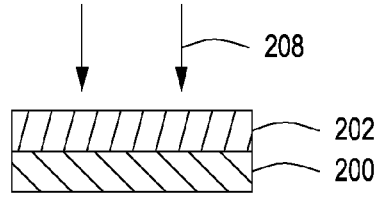

Next, at 106, the first waveform is adjusted to a second voltage waveform (second waveform) to increase the ion energy of the plasma from the first ion energy 206 to a second ion energy 208. As depicted in FIG. 2B, the plasma at the second ion energy 208 ceases to deposit the polymer layer 204 and proceeds to etch the polymer layer 204 and the dielectric layer 202. In some embodiments, the second ion energy of the plasma is about 50 eV to about 3000 eV.

In some embodiments, adjusting the first waveform to the second waveform comprises varying the phase of the waveform in addition to varying the tailoring of the waveform shape. FIGS. 5A-5C depict exemplary tailored waveforms with different phases. In some embodiments, as depicted in FIG. 5A, first waveform 501 having phase A is used to deposit polymer layer 204 directly atop a dielectric layer 202. The phase change between the first waveform and the second waveform to transition from a polymer deposition regime to an etching regime is dependent upon the composition of the process gas. In some embodiments, depending on the composition of the process gas adjusting the first waveform 501 to a second waveform 502, depicted in FIG. 5B, having a phase B, or to a third voltage waveform 503, depicted in FIG. 5C, having a phase C, increases the ion energy of the plasma to etch the polymer layer 204 and the dielectric layer 202. For example, a first waveform formed by applying a power of 150 W at 13 MHz and having a phase of 270 degrees provides the necessary ion energy for polymer deposition. Adjusting the phase to 180 degrees while maintaining substantially the same power and process gas composition increases the ion energies sufficient to etch the polymer layer and underling dielectric material. In some embodiments, 104-106 can be repeated until the dielectric layer 202 is etched to a predetermined thickness.

Returning to FIG. 3, the substrate 310 may enter the process chamber 302 via an opening 312 in a wall of the process chamber 302. The opening 312 may be selectively sealed via a slit valve 318, or other mechanism for selectively providing access to the interior of the chamber through the opening 312. The substrate support pedestal 308 may be coupled to a lift mechanism 334, such as a motor, actuator, or the like, that may control the position of the substrate support pedestal 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support pedestal 308 may be disposed above the opening 312 to provide a symmetrical processing region.

The one or more gas inlets (e.g., the showerhead 314) may be coupled to a gas supply 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction to provide the process gases at predetermined flow rates at a constant flow rate, or pulsed (as described above).

Although a showerhead 314 is shown in FIG. 3, additional or alternative gas inlets may be provided such as nozzles or inlets disposed in the ceiling or on the sidewalls of the process chamber 302 or at other locations suitable for providing gases to the process chamber 302, such as the base of the process chamber, the periphery of the substrate support pedestal, or the like.

The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). 302. The vacuum pump 328 may be fluidly coupled to an exhaust outlet 332 for routing the exhaust to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, the disclosure may be implemented in software and executed using a computer system, in hardware as, e.g., an application specific integrated circuit or other type of hardware implementation, or as a combination of software and hardware. The software routine 358 may be executed after the substrate 310 is positioned on the substrate support pedestal 308. The software routine 358, when executed by the CPU 352, transforms the general purpose computer into a specific purpose computer (controller) 350 that controls the chamber operation such that the methods disclosed herein are performed.

While the foregoing is directed to embodiments of the present disclosure, other and further embodiments of the disclosure may be devised without departing from the basic scope thereof.

The invention claimed is:

1. A method of processing a substrate within a processing volume of a substrate processing chamber, comprising:
   (a) providing a process gas comprising a polymer-forming gas and an etching gas between a first electrode and a second electrode within the processing volume, wherein the first electrode is opposite the second electrode;
   (b) applying a first voltage waveform from a first RF power source to the second electrode to form a plasma from the process gas, wherein the plasma has a first ion energy to deposit a polymer layer directly atop a dielectric layer of the substrate; and
   (c) adjusting the first voltage waveform to a second voltage waveform to increase an ion energy of the plasma from the first ion energy to a second ion energy, wherein the plasma at the second ion energy ceases to deposit the polymer layer and proceeds to etch the polymer layer and the dielectric layer.

2. The method of claim 1, wherein the polymer-forming gas comprises a fluorocarbon gas.

3. The method of claim 2, wherein the etching gas comprises a noble gas.

4. The method of claim 1, wherein the process gas further comprises an oxygen containing gas.

5. The method of claim 1, wherein the first ion energy of the plasma is about 0.1 eV to about 100 eV.

6. The method of claim 1, wherein the second ion energy of the plasma is about 50 eV to about 3000 eV.

7. The method of claim 1, wherein the second electrode is disposed within a substrate support pedestal.

8. The method of claim 1, further comprising applying energy from a second RF power source to the first electrode.

9. The method of claim 8, wherein the second RF power source provides about 50 W about 2000 W of power to the first electrode.

10. The method of claim 1, further comprising repeating (b)-(c) to etch the dielectric layer to a predetermined thickness.

11. The method of claim 1, wherein adjusting the first voltage waveform to the second voltage waveform comprises varying a waveform shape and phase between the first voltage waveform and the second voltage waveform using a waveform adjuster coupled between the first RF power source and the second electrode.

12. The method of claim 1, wherein a pressure in the processing volume is about 20 mTorr to about 200 mTorr.

13. A method of processing a substrate, comprising:
   (a) providing a substrate to a substrate processing chamber comprising a first electrode and a second electrode disposed opposite the first electrode;
   (b) providing a process gas to the substrate processing chamber, wherein the process gas comprises a polymer-forming gas and an etching gas;
   (c) applying a first voltage waveform from a first RF power source to the second electrode to form a plasma from the process gas, wherein the first RF power source is coupled to the second electrode through a first waveform adjuster, and wherein the plasma has a first ion energy to deposit a polymer layer directly atop a dielectric layer of the substrate; and
   (d) adjusting the first voltage waveform to a second waveform to increase an ion energy of the plasma from the first ion energy to a second ion energy, wherein the plasma at the second ion energy ceases to deposit the polymer layer and proceeds to etch the polymer layer and the dielectric layer.

14. The method of claim 13, wherein the first ion energy of the plasma is about 0.1 eV to about 100 eV and wherein the second ion energy of the plasma is about 50 eV to about 3000 eV.

15. The method of claim 13, further comprising repeating (c)-(d) to etch the dielectric layer to a predetermined thickness.

16. The method of claim 13, wherein adjusting the first voltage waveform to the second waveform comprises varying a waveform shape and phase between the first voltage waveform and the second waveform.

17. A method of processing a substrate within a processing volume of a substrate processing chamber, comprising:
   (a) providing a process gas comprising a polymer-forming gas and an etching gas between a first electrode and a second electrode within the processing volume, wherein the first electrode is opposite the second electrode;
   (b) applying a first voltage waveform from a first RF power source to the second electrode to form a plasma from the process gas, wherein the plasma has a first ion energy to deposit a polymer layer directly atop a dielectric layer of the substrate; and
   (c) adjusting the first voltage waveform to a second voltage waveform to increase an ion energy of the plasma from the first ion energy to a second ion energy, wherein the plasma at the second ion energy ceases to deposit the polymer layer and proceeds to etch the polymer layer and the dielectric layer, and wherein adjusting the first voltage waveform to the second voltage waveform comprises varying a waveform shape and phase between the first voltage waveform and the second voltage waveform.

18. The method of claim 17, wherein the etching gas comprises a noble gas.

19. The method of claim 17, wherein the first ion energy of the plasma is about 0.1 eV to about 100 eV and the second ion energy of the plasma is about 50 eV to about 3000 eV.

20. The method of claim 17, wherein the polymer-forming gas comprises a fluorocarbon gas.

* * * * *